United States Patent
Schuh et al.

(10) Patent No.: US 10,711,087 B2
(45) Date of Patent: *Jul. 14, 2020

(54) PROCESSES FOR PRODUCING VISCOUS EPOXY SYRUPS

(71) Applicant: TESA SE, Norderstedt (DE)

(72) Inventors: Christian Schuh, Hamburg (DE); Klaus Keite-Telgenbüscher, Hamburg (DE); Yao Shu, Horb am Neckar (DE)

(73) Assignee: TESA SE, Norderstedt (DE)

( * ) Notice: Subject to any disclaimer, the term of this patent is extended or adjusted under 35 U.S.C. 154(b) by 17 days.

This patent is subject to a terminal disclaimer.

(21) Appl. No.: 15/171,037

(22) Filed: Jun. 2, 2016

(65) Prior Publication Data

US 2016/0355634 A1 Dec. 8, 2016

(30) Foreign Application Priority Data

Jun. 4, 2015 (DE) .................. 10 2015 210 346

(51) Int. Cl.
*C08G 59/02* (2006.01)
*C08G 59/68* (2006.01)
(Continued)

(52) U.S. Cl.
CPC .......... *C08G 59/022* (2013.01); *C08G 59/02* (2013.01); *C08G 59/68* (2013.01); *C09J 163/00* (2013.01);
(Continued)

(58) Field of Classification Search
None
See application file for complete search history.

(56) References Cited

U.S. PATENT DOCUMENTS

| 3,729,313 A | 4/1973 | Smith |
| 3,741,769 A | 6/1973 | Smith |

(Continued)

FOREIGN PATENT DOCUMENTS

| AU | 158128 B2 | 3/2003 |
| CN | 104011161 A | 8/2014 |

(Continued)

OTHER PUBLICATIONS

Momentive, "Epon and Epi-Rez Epoxy Resins," copyright 2012. (Year: 2012).*

(Continued)

*Primary Examiner* — Randy P Gulakowski
*Assistant Examiner* — Ha S Nguyen
(74) *Attorney, Agent, or Firm* — Norris McLaughlin, P.A.

(57) ABSTRACT

A process for producing a viscous epoxy syrup from at least one liquid multifunctional epoxy, comprising the steps of:
adding an initiator selected from the group consisting of electron-poor monoisocyanate, photoinitiator and thermal initiator to at least one liquid multifunctional epoxy;
mixing the components;
polymerizing the multifunctional epoxy such that the viscosity of the resulting epoxy syrup is at least twice as high, preferably at least four times as high and in particular at least ten times as high as the viscosity of the employed epoxy in the unreacted state
makes it possible to produce epoxy adhesives having pressure-sensitive properties.

16 Claims, 2 Drawing Sheets

(51) Int. Cl.

| | |
|---|---|
| *C08G 59/40* | (2006.01) |
| *C08G 59/32* | (2006.01) |
| *C08G 59/24* | (2006.01) |
| *C08G 59/22* | (2006.01) |
| *C09J 7/20* | (2018.01) |
| *C09J 7/38* | (2018.01) |
| *H01L 51/00* | (2006.01) |
| *H01L 51/52* | (2006.01) |
| *H01L 51/44* | (2006.01) |
| *H01L 51/10* | (2006.01) |
| *H01L 25/04* | (2014.01) |
| *C08K 5/16* | (2006.01) |
| *C09J 163/00* | (2006.01) |

(52) U.S. Cl.
CPC ........ *H01L 51/0035* (2013.01); *H01L 25/046* (2013.01); *H01L 51/107* (2013.01); *H01L 51/448* (2013.01); *H01L 51/5237* (2013.01)

(56) References Cited

U.S. PATENT DOCUMENTS

| | | | |
|---|---|---|---|
| 4,058,401 A | 11/1977 | Crivello | |
| 4,138,255 A | 2/1979 | Crivello | |
| 4,231,951 A | 11/1980 | Smith et al. | |
| 4,250,053 A | 2/1981 | Smith | |
| 4,256,828 A | 3/1981 | Smith | |
| 4,394,403 A | 7/1983 | Smith | |
| 5,242,715 A | 9/1993 | Schoen et al. | |
| 5,721,289 A * | 2/1998 | Karim | C08F 283/10 522/113 |
| 2010/0063221 A1 | 3/2010 | Manabe et al. | |
| 2014/0315016 A1 | 10/2014 | Dollase et al. | |
| 2015/0079389 A1* | 3/2015 | Krawinkel | C09J 193/04 428/355 R |
| 2016/0355712 A1 | 12/2016 | Schuh et al. | |

FOREIGN PATENT DOCUMENTS

| | | | |
|---|---|---|---|
| DE | 10 2005 062441 A1 | 6/2007 | |
| DE | 102012206273 A1 * | 10/2013 | ............ C09J 193/04 |
| DE | 10 2014 208 111 A1 | 10/2015 | |
| EP | 0 542 716 B1 | 6/1997 | |
| JP | 11021532 A * | 1/1999 | |
| JP | H1121532 A | 1/1999 | |
| JP | 2003-105109 A | 4/2003 | |
| JP | 2003105109 A * | 4/2003 | |
| SG | 160949 B | 11/2012 | |
| WO | 96/14349 A1 | 5/1996 | |
| WO | 2009/055666 A1 | 4/2009 | |

OTHER PUBLICATIONS

German Search Report dated Jan. 22, 2016.
Database WPI XP-002762817, Thomson Scientific, London, GB.
European Search Report corresponds to European Application No. 16169349 dated Oct. 16, 2016.
Translation of Office Action dated Feb. 12, 2018, and issued in connection with Taiwanese Patent Application No. 105115421.
Office Action for co-pending Chinese Application No. 201610391174.4 dated Feb. 27, 2020 (English Translation).

* cited by examiner

"PROCESSES FOR PRODUCING VISCOUS EPOXY SYRUPS"

This application claims foreign priority benefit under 35 U.S.A. § 119 of German Patent Application No. 10 2015 210 346.3, filed Jun. 4, 2015.

The present invention relates to processes for producing a viscous epoxy syrup from at least one liquid multifunctional epoxy, comprising the steps of adding an initiator selected from the group consisting of electron-poor monoisocyanate, photoinitiator and thermal initiator to at least one liquid multifunctional epoxy and polymerizing the multifunctional epoxy, to a viscous epoxy syrup obtainable by the process, to an adhesive and to an adhesive tape comprising this epoxy syrup and also to the use of such an epoxy syrup, such an adhesive or such an adhesive tape.

BACKGROUND OF THE INVENTION

Epoxy adhesives having pressure-sensitive properties may be prepared by addition of matrix polymers. Adhesive bond strength often increases with increasing amount of epoxy. Since most epoxies are used in liquid adhesives they have a relatively low viscosity and high epoxy contents thus do not afford pressure-sensitive tapes. High-viscosity/solid epoxies are required therefor.

The viscosity of epichlorohydrin-based epoxy resins is typically adjusted via the ratio of epichlorohydrin and a resulting molecular weight increase at the expense of epoxy concentration ["Epoxy Adhesive Formulations" 2006, E. M. Petrie, p. 30ff]. A number of examples such as epoxy (cresol) novolacs are produced via a different synthetic route and carry the epoxy groups as a side group so that an increase in molecular weight does not lead to a reduction in epoxy concentration.

However apart from the epoxy novolacs referred to hereinabove and the oligomers produced with epichlorohydrin, there are no processes for obtaining epoxies, in particular also epoxies other than those mentioned, in a high-viscosity state.

More specialized epoxy monomers, for example epoxycyclohexyl derivatives, which are not produced via the epichlorohydrin route are accordingly often very liquid (e.g. Uvacure 1500). Since many epoxies are used for crosslinking reaction (they contain more than one epoxy group per molecule) they cannot simply be polymerized to increase viscosity since crosslinked and insoluble deposits are immediately formed. These epoxycyclohexyl monomers are preferably employed in cationically curable adhesives, in particular for UV-induced curing via photolabile acid generators.

There is therefore a need for a method of increasing the viscosity of epoxies not obtained via the epichlorohydrin route.

AU 758128 B2 describes such storage-stable cationically curing multifunctional epoxy mixtures. To achieve storage stability of the multifunctional epoxy resins it is necessary according to this document to avoid undesired premature polymerization. This is achieved by adding 0.0005 to 10 wt % of an organic and/or inorganic alkaline earth metal or alkali metal compound during the polymerization of multifunctional epoxy monomers. Polymerization before desired crosslinking is thus to be avoided in any event. In addition to the inventive stabilization of these adhesives it follows from this document that for cationically curable liquid adhesives epoxycyclohexyl derivatives are particularly preferred so that it would be desirable to be able to produce high-viscosity epoxies from this monomer as well.

SG 160949 B proposes reacting diepoxies with diisocyanates. This mixture affords cyclic trimers (isocyanurates) and oxazolidinones having an $M_w$<3000 g/mol and a low polydispersity which can then be cured like epoxies. It is necessary to use at least difunctional substances since otherwise no reactive groups would be available for the subsequent curing. However, the compounds formed have low viscosities.

The present invention accordingly has for its object the provision of a process which makes it possible to produce specifically viscous adhesive resins from originally liquid epoxies. The product shall be soluble in solvents and meltable by the temperature being raised.

SUMMARY OF THE INVENTION

The object is achieved by a process of the type referred to at the outset where the components are initially mixed and the polymerization of the multifunctional epoxy is subsequently effected such that the viscosity of the resulting epoxy syrup is at least twice as high, preferably at least four times as high and in particular at least ten times as high as the viscosity of the employed epoxy in the unreacted state. This incipiently polymerizes the epoxies such that high molecular weight polyepoxies are prepared from, for example, bisepoxy monomers without these undergoing crosslinking. The thus obtained epoxy syrups are ideally suited for producing epoxy adhesives having pressure-sensitive properties. It is important here that initiation is effected only after the initiator is thoroughly distributed in the epoxy. Otherwise the reactive centres are too close together and crosslinking occurs which is not yet desired at this stage. In order to achieve mixing the mixture may be stirred for example, but other forms of mixing are also conceivable and possible.

DETAILED DESCRIPTION

Figure 1:
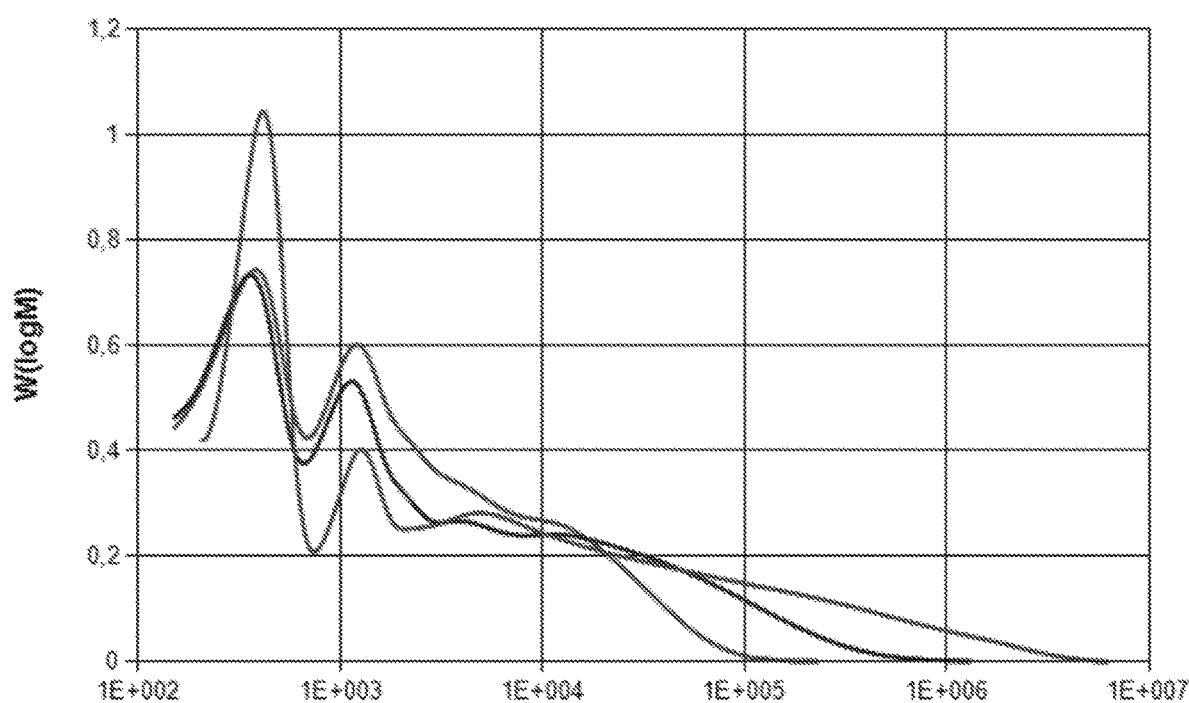
FIG. 1 shows the molecular weight distribution of Uvacure syrups polymerized over time periods of different durations.

All viscosities reported in this application relate, unless otherwise stated, to a measurement at 23° C. according to DIN 53019-1.

The term "epoxy syrup" describes epoxies having a viscosity of at least 1 Pa·s (corresponds to 1000 mPs).

It is particularly advantageous when the process according to the invention is carried out such that in the resulting epoxy syrup at least 65%, preferably at least 75%, in particular at least 80%, of the original epoxy groups are still present. A large part of the epoxy units in the syrup is thus still present in the monomer form. It is accordingly further advantageous when the resulting epoxy syrup comprises high molecular weight uncrosslinked polyepoxies. It is thus particularly useful when in the epoxy syrup a large amount of the multifunctional epoxy monomers employed is still present in unreacted form as monomer and high molecular weight, but still uncrosslinked, polyepoxies have been formed only sporadically.

Particularly suitable multifunctional epoxies are bisepoxies. Once polymerization has been effected a further epoxy group is available which can later bring about crosslinking in the epoxy adhesive resin.

Multifunctional epoxies that have proven particularly advantageous include bisepoxycyclohexyl derivatives, in particular 3,4-epoxycyclohexylmethyl-3,4-epoxycyclohexane carboxylate, and bisepoxies based on bisphenol-A, bisphenol-S or bisphenol-F. These make it possible to produce syrups having a viscosity which is well-suited for further processing the epoxies to afford pressure-sensitive epoxy resins.

The process according to the invention performs particularly well when the initiator is selected from the group consisting of photoinitiator and thermal initiator and is employed in an amount of not more than 0.1 wt %, preferably not more than 0.08 wt %, particularly preferably not more than 0.05 wt %. This allows the target viscosities to be achieved in a particularly simple and easy-to-handle fashion.

In addition to these classical initiators for cationic epoxy curing, specific isocyanates are surprisingly also particularly suitable as initiators for the present invention.

A particularly suitable initiator is an electron-poor monoisocyanate which is employed in an amount of not more than 10 wt %, preferably not more than 8 wt % and in particular not more than 7 wt %. The reaction is particularly easily controllable when the monoisocyanate is employed in an amount of 7±0.5 wt %. Suitable monoisocyanates are in particular selected from the group consisting of p-tolyl isocyanate, o-tolyl isocyanate and sulphonyl isocyanates, in particular p-toluenesulphonylmethyl isocyanate, o-toluenesulphonylmethyl isocyanate, 4-chlorobenzylsulphonyl isocyanate, o-toluenesulphonyl isocyanate, p-toluenesulphonyl isocyanate and benzylsulphonyl isocyanate, p-toluenesulphonyl isocyanate being particularly preferred.

A temperature range which has proven particularly advantageous for carrying out the process is the range between 20° C. and 120° C., preferably between 40° C. and 100° C., in particular between 80° C. and 90° C.

There is a correlation between the temperature and the amount of initiator. The more initiator is added the lower the temperature required to achieve the same reaction rate. While, for example, in the case of the electron-poor isocyanates 10 wt % of initiator will bring about only a very slow rate at room temperature, at 85° C. 7 wt % of initiator is sufficient to carry out the reaction within just a few hours.

It is moreover advantageous when the polymerization is stopped by addition of an initiator scavenger upon reaching a desired viscosity. This makes it possible to make the obtained epoxy syrups storage-stable. Even at higher temperatures of 80° C. for example, the obtained epoxy syrups are storage-stable over several months. Particularly suitable initiator scavengers include a mixture of water and acetone, solutions of alkali metal/alkaline earth metal hydroxides or solutions of alkali metal/alkaline earth metal alkoxides. When a mixture of water and acetone is used a 1:1 ratio of the two components is particularly preferred.

The amount of initiator scavenger should preferably be equal/substantially equal to the amount of initiator. Thus, when 7 g of initiator are used it is advantageous to also use 7 g of initiator scavenger.

The process according to the invention is moreover particularly advantageous when the polymerization of the multifunctional epoxy is effected such that the resulting epoxy syrup has a polydispersity D of at least 3, preferably at least 5, in particular of at least 8. However, the polydispersity is not obtained as a result, for instance, of mixing different polymers but rather as a result of polymer molecules of very different sizes forming on account of the reaction conditions. Polydispersity D is a measure of the distribution of the molar masses. Polydispersity D is defined as the weight-average molecular weight $M_w$/the number-average molecular weight $M_n$ of the polymers present. A large polydispersity value thus means a broad molar mass distribution from very short-chain up to long-chain macromolecules, i.e. molecules of many different chain lengths are present in the polymer.

For the present invention this means that the mono-, bi- and multimodal molecular weight distribution is such that molecules of low molecular weight constituents (<2000 g/mol) right through to very high molecular weight constituents (>300 000 g/mol) may be found.

This special feature of the molecular weight distribution contributes in particular to the advantageous properties according to the invention of a high epoxy content (many low molecular weight bisepoxies) coupled with the high-viscosity characteristics (very high molecular weight epoxies) of the product.

It was found that, surprisingly, the process according to the invention results in a slow increase in viscosity during the polymerization. The viscosity increase is attributable to the formation of very high molecular weight polyepoxies. Although multifunctional, in particular difunctional, epoxies which very rapidly form insoluble highly crosslinked networks are concerned, the epoxy adhesive resins produced with this process remain soluble. The explanation for this behaviour is that relatively few initiating species are formed by the initiator, for example the p-toluenesulphonylmethyl isocyanate, that the growing chains thus cannot meet and that consequently at very low epoxy conversions few very high molecular weight polymers are formed. GPC measurements and FT-IR spectra support this theory. It is important here that initiation is effected only after the initiator is thoroughly distributed in the epoxy so that no crosslinking is effected at this stage.

The invention further relates to viscous epoxy syrups obtainable by the process according to the invention. The present invention further relates to viscous epoxy syrups comprising multifunctional epoxy monomers and high molecular weight uncrosslinked multifunctional polyepoxies prepared therefrom, wherein the viscosity of the epoxy syrup is at least twice as high, preferably at least four times as high and in particular at least ten times as high as the viscosity of the employed epoxy in the unreacted state.

It is preferable when the molecular weight distribution of the polyepoxies present in the epoxy syrup encompasses at least the range from 2000 g/mol to 300 000 g/mol. This means the epoxy syrup contains epoxy molecules having very different molecular weights, from very low to very high, all compounds from the low molecular weight (<2000 g/mol) right through to the high molecular weight (>300 000 g/mol) being present. Compounds having a lower or even higher molecular weight may also be present.

It is preferable when the viscosity increase experienced by the epoxy syrups according to the invention during storage at 25° C. is less than 5 Pa s per day. This represents a sufficient storage stability which makes it possible to store the epoxy syrups over a relatively long period of time before they are used.

Particular preference is given to viscous epoxy syrups where the epoxy monomer is 3,4-epoxycyclohexylmethyl-3,4-epoxycyclohexane carbon/late and the viscosity is at least 1 Pa s (1000 mPs), preferably 10 Pa s (10 000 mPs), in particular 25 Pa s (25 000 mPs).

The present invention also relates to an adhesive having water vapour barrier properties, comprising an adhesive base composed of at least one epoxy syrup according to the invention, at least one elastomer, optionally a solvent, wherein the adhesive base has a water vapour permeation rate after activation of the reactive resin component of less than 100 g/m²d, preferably of less than 60 g/m²d, in particular less than 30 g/m²d. The epoxy syrups according to the invention are particularly well-suited for such adhesives having water vapour barrier properties because, on account of their viscosity, they are readily processable and above all make it possible to produce adhesives having a sufficient viscosity so that the thus obtained adhesives are easy to handle and easy to apply.

The present invention moreover relates to an adhesive tape comprising a viscous epoxy syrup according to the invention or an adhesive having water vapour barrier properties according to the invention. Such adhesive tapes allow for particularly simple application.

One area of application for which the present epoxy syrups/the adhesive produced therefrom or the adhesive tape produced therefrom are exceptionally suitable is the encapsulation of assemblies in the field of organic electronics. However countless further applications requiring a pressure-sensitive epoxy resin adhesive are also conceivable.

Particularly preferred initiators for the polymerization reaction include, as previously intimated, electron-poor monoisocyanates, for example p-tolyl isocyanate, p-toluenesulphonylmethyl isocyanate, o-tolyl isocyanate or o-toluenesulphonylmethyl isocyanate. Particular preference is given to derivatives of sulphonyl isocyanates (R—SO₂—NCO, R—SO₂—CH₂—NCO), for example 4-chlorobenzylsulphonyl isocyanate, o-toluenesulphonyl isocyanate, p-toluenesulphonyl isocyanate, benzylsulphonyl isocyanate.

Examples of photoinitiators with which the inventive molecular weight distributions may be achieved include but are not limited to:

sulphonium salts (see for example U.S. Pat. Nos. 4,231,951 A, 4,256,828 A, 4,058,401 A, 4,138,255 A and US 2010/063221 A1) such as triphenylsulphonium hexafluoroarsenate, triphenylsulphonium hexafluoroborate, triphenylsulphonium tetrafluoroborate, triphenylsulphonium tetrakis(pentafluorobenzyl)borate, methyldiphenylsulphonium tetrafluoroborate, methyldiphenylsulphonium tetrakis(pentafluorobenzyl)borate, dimethylphenylsulphonium hexafluorophosphate, triphenylsulphonium hexafluorophosphate, triphenylsulphonium hexafluoroantimonate, diphenylnaphthylsulphonium hexafluoroarsenate, tritolylsulphonium hexafluorophosphate, anisyldiphenylsulphonium hexafluoroantimonate, 4-butoxyphenyldiphenylsulphonium tetrafluoroborate, 4-butoxyphenyldiphenylsulphonium tetrakis(pentafluorobenzyl)borate, 4-chlorophenyldiphenylsulphonium hexafluoroantimonate, tris(4-phenoxyphenyl)sulphonium hexafluorophosphate, di(4-ethoxyphenyl)methylsulphonium hexafluoroarsenate, 4-acetylphenyldiphenylsulphonium tetrafluoroborate, 4-acetylphenyldiphenylsulphonium tetrakis(pentafluorobenzyl)borate, tris(4-thiomethoxyphenyl)sulphonium hexafluorophosphate, di(methoxysulphonylphenyl)methylsulphonium hexafluoroantimonate, di(methoxynaphthyl)methylsulphonium tetrafluoroborate, di(methoxynaphthyl)methylsulphonium tetrakis(pentafluorobenzyl)borate, di(carbomethoxyphenyl)methylsulphonium hexafluorophosphate, (4-octyloxyphenyl)diphenylsulphonium tetrakis(3,5-bistrifluoromethylphenyl)borate, tris[4-(4-acetylphenyl)thiophenyl]sulphonium tetrakis(pentafluorophenyl)borate, tris(dodecylphenyl)sulphonium tetrakis(3,5-bistrifluoromethylphenyl)borate, 4-acetamidophenyldiphenylsulphonium tetrafluoroborate, 4-acetamidophenyldiphenylsulphonium tetrakis(pentafluorobenzyl)borate, dimethylnaphthylsulphonium hexafluorophosphate, trifluoromethyldiphenylsulphonium tetrafluoroborate, trifluoromethyldiphenylsulphonium tetrakis (pentafluorobenzyl)borate, phenylmethylbenzylsulphonium hexafluorophosphate, 5-methylthianthrenium hexafluorophosphate, 10-phenyl-9,9-dimethylthioxanthenium hexafluorophosphate, 10-phenyl-9-oxothioxanthenium tetrafluoroborate, 10-phenyl-9-oxothioxanthenium tetrakis(pentafluorobenzyl)h-borate, 5-methyl-10-oxothianthrenium tetrafluoroborate, 5-methyl-10-oxothianthrenium tetrakis(pentafluorobenzyl)borate and 5-methyl-10,10-dioxothianthrenium hexafluorophosphate or p-toluenesulphonyl isocyanate or iodonium salts (see for example U.S. Pat. Nos. 3,729,313 A, 3,741,769 A, 4,250,053 A, 4,394,403 A and US 2010/063221 A1) such as diphenyliodonium tetrafluoroborate, di(4-methylphenyl)iodonium tetrafluoroborate, phenyl-4-methylphenyliodonium tetrafluoroborate, di(4-chlorophenyl)iodonium hexafluorophosphate, dinaphthyliodonium tetrafluoroborate, di(4-trifluoromethylphenyl)iodonium tetrafluoroborate, diphenyliodonium hexafluorophosphate, di(4-methylphenyl)iodonium hexafluorophosphate, diphenyliodonium hexafluoroarsenate, di(4-phenoxyphenyl)iodonium tetrafluoroborate, phenyl-2-thienyliodonium hexafluorophosphate, 3,5-dimethylpyrazolyl-4-phenyliodonium hexafluorophosphate, diphenyliodonium hexafluoroantimonate, 2,2'-diphenyliodonium tetrafluoroborate, di(2,4-dichlorophenyl)iodonium hexafluorophosphate, di(4-bromophenyl)iodonium hexafluorophosphate, di(4-methoxyphenyl)iodonium hexafluorophosphate, di(3-carboxyphenyl)iodonium hexafluorophosphate, di(3-methoxycarbonylphenyl)iodonium hexafluorophosphate, di(3-methoxysulphonylphenyl)iodonium hexafluorophosphate, di(4-acetamidophenyl)iodonium hexafluorophosphate, di(2-benzothienyl)iodonium hexafluorophosphate, diaryliodonium tristrifluoromethylsulphonylmethide such as diphenyliodonium hexafluoroantimonate, diaryliodonium tetrakis(pentafluorophenyl)borate such as diphenyliodonium tetrakis(pentafluorophenyl)borate, (4-n-desiloxyphenyl)phenyliodonium hexafluoroantimonate, [4-(2-hydroxy-n-tetradesiloxy)phenyl]phenyliodonium hexafluoroantimonate, [4-(2-hydroxy-n-tetradesiloxy)phenyl]phenyliodonium trifluorosulphonate, [4-(2-hydroxy-n-tetradesiloxy)phenyl]phenyliodonium hexafluorophosphate, [4-(2-hydroxy-n-tetradesiloxy)phenyl]phenyliodonium tetrakis(pentafluorophenyl)borate, bis(4-tert-butylphenyl)iodonium hexafluoroantimonate, bis(4-tert-butylphenyl)iodonium hexafluorophosphate, bis(4-tert-butylphenyl)iodonium trifluorosulphonate, bis(4-tert-butylphenyl)iodonium tetrafluoroborate, bis(dodecylphenyl)iodonium hexafluoroantimonate, bis(dodecylphenyl)iodonium tetrafluoroborate, bis(dodecylphenyl)iodonium hexafluorophosphate, bis(dodecylphenyl)iodonium trifluoromethylsulphonate, di(dodecylphenyl)iodonium hexafluoroantimonate, di(dodecylphenyl)iodonium triflate, diphenyliodonium bisulphate, 4,4'-dichlorodiphenyliodonium bisulphate, 4,4'-dibromodiphenyliodonium bisulphate, 3,3'-dinitrodiphenyliodonium bisulphate, 4,4'-dimethyldiphenyliodonium bisulphate, 4,4'-bissuccinimidodiphenyliodonium bisulphate, 3-nitrodiphenyliodonium bisulphate, 4,4'-dimethoxydiphenyliodonium bisulphate, bis(dodecylphenyl)iodonium tetrakis(pentafluorophenyl)borate, (4-octyloxyphenyl)phenyliodonium tetrakis(3,5-bistrifluoromethylphenyl)borate and (tolylcumyl)iodonium tetrakis(pentafluorophenyl)borate or ferrocenium salts (see for example EP 542 716 B1) such as n₅-(2,4-cyclopentadien-1-yl)-[(1,2,3,4,5,6,9)-(1-methylethyl)benzene]iron.

Examples of commercialized photoinitiators include Cyracure UVI-6990, Cyracure UVI-6992, Cyracure UVI-6974 and Cyracure UVI-6976 from Union Carbide, Optomer SP-55, Optomer SP-150, Optomer SP-151, Optomer SP-170 and Optomer SP-172 from Adeka, San-Aid SI-45L, San-Aid SI-60L, San-Aid SI-80L, San-Aid SI-100L, San-Aid SI-110L, San-Aid SI-150L and San-Aid SI-180L from Sanshin Chemical, SarCat CD-1010, SarCat CD-1011 and SarCat CD-1012 from Sartomer, Degacure K185 from Degussa, Rhodorsil Photoinitiator 2074 from Rhodia, CI-2481, CI-2624, CI-2639, CI-2064, CI-2734, CI-2855, CI-2823 and CI-2758 from Nippon Soda, Omnicat 320, Omnicat 430, Omnicat 432, Omnicat 440, Omnicat 445, Omnicat 550, Omnicat 550 BL and Omnicat 650 from IGM Resins, Daicat II from Daicel, UVAC 1591 from Daicel-Cytec, FFC 509 from 3M, BBI-102, BBI-103, BBI-105, BBI-106, BBI-109, BBI-110, BBI-201, BBI-301, BI-105, DPI-105, DPI-106, DPI-109, DPI-201, DTS-102, DTS-103, DTS-105, NDS-103, NDS-105, NDS-155, NDS-159, NDS-165, TPS-102, TPS-103, TPS-105, TPS-106, TPS-109, TPS-1000, MDS-103, MDS-105, MDS-109, MDS-205, MPI-103, MPI-105, MPI-106, MPI-109, DS-100, DS-101, MBZ-101, MBZ-201, MBZ-301, NAI-100, NAI-101, NAI-105, NAI-106, NAI-109, NAI-1002, NAI-1003, NAI-1004, NB-101, NB-201, NDI-101, NDI-105, NDI-106, NDI-109, PAI-01, PAI-101, PAI-106, PAI-1001, PI-105, PI-106, PI-109, PYR-100, SI-101, SI-105, SI-106 and SI-109 from Midori Kagaku, Kayacure PCI-204, Kayacure PCI-205, Kayacure PCI-615, Kayacure PCI-625, Kayarad 220 and Kayarad 620, PCI-061T, PCI-062T, PCI-020T, PCI-022T from Nippon Kayaku, TS-01 and TS-91 from Sanwa Chemical, Deuteron UV 1240 from Deuteron, Tego Photocompound 1465N from Evonik, UV 9380 C-D1 from GE Bayer Silicones, FX 512 from Cytec, Silicolease UV Cata 211 from Bluestar Silicones and Irgacure 250, Irgacure 261, Irgacure 270, Irgacure PAG 103, Irgacure PAG 121, Irgacure PAG 203, Irgacure PAG 290, Irgacure CGI 725, Irgacure CGI 1380, Irgacure CGI 1907 and Irgacure GSID 26-1 from BASF.

Further systems likewise usable in accordance with the invention are known to those skilled in the art. Photoinitiators are used in uncombined form or as a combination of two or more photoinitiators.

Photoinitiators which exhibit absorption at less than 350 nm and advantageously at greater than 250 nm are advantageous. Initiators which absorb above 350 nm, for example in the range of violet light, are likewise employable. Particular preference is given to using sulphonium-based photoinitiators since they exhibit advantageous UV-absorption characteristics.

Thermal initiators for the cationic polymerization of epoxies

Examples of thermal initiators, so-called thermal acid generators (TAG), include benzylthiolanium salts with, for example, $PF_6^-$, $AsF_6^-$, or $SBF_6^-$ anions described in U.S. Pat. No. 5,242,715 A, $BF_3$-amine complexes described in "Study of Polymerization Mechanism and Kinetics of DGEBA with $BF_3$-amine Complexes Using FT-IR and Dynamic DSC" (Ghaemy et al., Iranian Polymer Journal, Vol. 6, No. 1, 1997), lanthanide triflates described in "Study of Lanthanide Triflates as New Curing Initiators for Cycloaliphatic Epoxy Resins" (C. Mas et al., Macromolecular Chemistry and Physics, 2001, 202, No. 12) or blocked superacids such as, for example, ammonium triflate; ammonium perfluorobutanesulphonate (PFBuS); ammonium Ad-TFBS [4-adamantanecarboxyl-1,1,2,2-tetrafluorobutanesulphonate]; ammonium AdOH-TFBS [3-hydroxy-4-adamantanecarboxyl-1,1,2,2-tetrafluorobutanesulphonate]; ammonium Ad-DFMS [adamantanylmethoxycarbonyldifluoromethanesulphonate]; ammonium AdOH-DFMS [3-hydroxyadamantanylmethoxycarbonyldifluoromethanesulphonate]; ammonium DHC-TFBSS [4-dehydrocholate-1,1,2,2-tetrafluorobutanesulphonate]; and ammonium ODOT-DFMS [hexahydro-4,7-epoxyisobenzofuran-1(3H)-one, 6-(2,2'-difluoro-2-sulphonatoacetic acid ester)].

Such systems are commercially available from King Industries under the names TAG-2678, TAG-2713 or TAG-2172. At high temperatures these blocked acids liberate, for example, trifluoromethanesulphonic acid, p-toluenesulphonic acid or dodecylbenzylsulphonic acid which initiate cationic curing of epoxies.

EXAMPLES

Methods of Measurement

Viscosity Measurement:

Dynamic viscosity is a measure for the flowability of the fluid coating material. Dynamic viscosity may be determined according to DIN 53019. A viscosity of less than $10^8$ Pa·s is described as a fluid. Viscosity is measured in a cylindrical rotational viscometer with a standard geometry according to DIN 53019-1 at a measurement temperature of 23° C. and a shear rate of 1 s$^{-1}$.

Molecular Weight Distribution:

The molecular weight determinations for the number-average molecular weights $M_n$ and the weight-average molecular weights $M_w$ were effected by means of gel permeation chromatography (GPC). The eluent employed was THF (tetrahydrofuran) comprising 0.1 vol % of trifluoroacetic acid. The measurement was effected at 25° C. A PSS-SDV 10µ ID 8.0 mm×50 mm precolumn was employed. PSS-SDV 10µ ID 8.0 mm×300 mm columns were used for separation. The sample concentration was 1.5 g/l and the flow rate was 0.5 ml per minute. Measurements were performed against poly(methyl methacrylate) standards.

The values reported in this document for the number-average molar mass $M_n$, the weight-average molar mass $M_w$ and the polydispersity relate to the determination by gel permeation chromatography (GPC)/the evaluation of such measurements.

Materials Employed:

| | |
|---|---|
| Uvacure 1500 | cycloaliphatic bisepoxy from Cytec ((3,4-epoxycyclohexane) methyl 3,4-epoxycyclohexylcarboxylate) |
| Epon Resin 828 | difunctional bisphenol-A/epichlorohydrin liquid epoxy having a weight per epoxy of 185-192 g/eq from Momentive. |
| p-toluenesulphonyl isocyanate (TSI) | electron-poor monoisocyanate |
| TAG-2678 | ammonium blocked trifluoromethanesulphonic acid from King Industries. |
| triarylsulphonium hexafluoroantimonate | cationic photoinitiator from Sigma-Aldrich The photoinitiator has an absorption maximum in the range from 320 nm to 360 nm and was provided as a 50 wt % solution in propylene carbonate |

Example 1

Initiation with Electron-Poor Monoisocyanates

In a 2 l polymerization reactor 1 kg of Uvacure 1500 was heated to 85° C. under a nitrogen atmosphere. The Uvacure 1500 has a viscosity of 0.25 Pa s. The initiator was added in countercurrent with nitrogen and the solution was stirred slowly.

To enable determination of the molecular weight distributions and viscosities, samples were taken at different reaction times during the reaction and analyzed by means of GPC and viscometry.

TABLE 1

GPC results for inventive epoxy syrups initiated with TSI

| amount of TSI [%] | Mw [g mol$^{-1}$] | Mn [g mol$^{-1}$] | D | reaction time [h] | temperature [° C.] |
|---|---|---|---|---|---|
| 6 | 13 500 | 780 | 17.4 | 3.25 | 100 |
| 6 | 11 100 | 740 | 15.1 | 4.25 | 100 |
| 6 | 22 000 | 790 | 27.9 | 5.25 | 100 |
| 7 | 22 500 | 830 | 27.3 | 1.0 | 100 |
| 7 | 59 700 | 830 | 71.7 | 2.25 | 100 |
| 7 | 78 400 | 850 | 92 | 3.75 | 100 |
| 7.4 | 5100 | 630 | 8 | 0.5 | 100 |
| 7.4 | 6000 | 600 | 9.9 | 1 | 100 |
| 7.4 | 16 100 | 650 | 24.8 | 3.3 | 100 |

It is apparent that polydispersity increases with increasing reaction time. For the substances used in the example there is a reaction rate maximum at an amount of TSI of 7 wt %. The use of a greater amount of initiator does not result in higher reaction rates here.

TABLE 2 viscosities of inventive epoxy syrups initiated with TSI

| amount of TSI [%] | reaction time [min] | viscosity [Pa s] |
|---|---|---|
| 6 | 30 | 10.9 |
| 6 | 60 | 40 |
| 6 | 90 | 67.2 |
| 6 | 130 | 132 |
| 6 | 180 | 203 |
| 6 | 230 | 334 |
| 7 | 30 | 39.6 |
| 7 | 60 | 115 |
| 7 | 90 | 230 |
| 7 | 120 | 420 |
| 7 | 190 | 1536 |
| 7 | 210 | 1956 |

It is readily apparent also from table 2 that a greater amount of initiator causes the reaction to proceed markedly more rapidly and that a viscosity increase is achieved very much more rapidly.

FIG. 1 shows the molecular weight distribution of Uvacure syrups polymerized over time periods of different durations. What is striking is the enormously broad distribution containing many molecules smaller than 1000 g/mol but also chains of in some cases up to greater than 10$^6$ g/mol which bring about the high viscosity.

Stopping the Reaction

Figure 2:
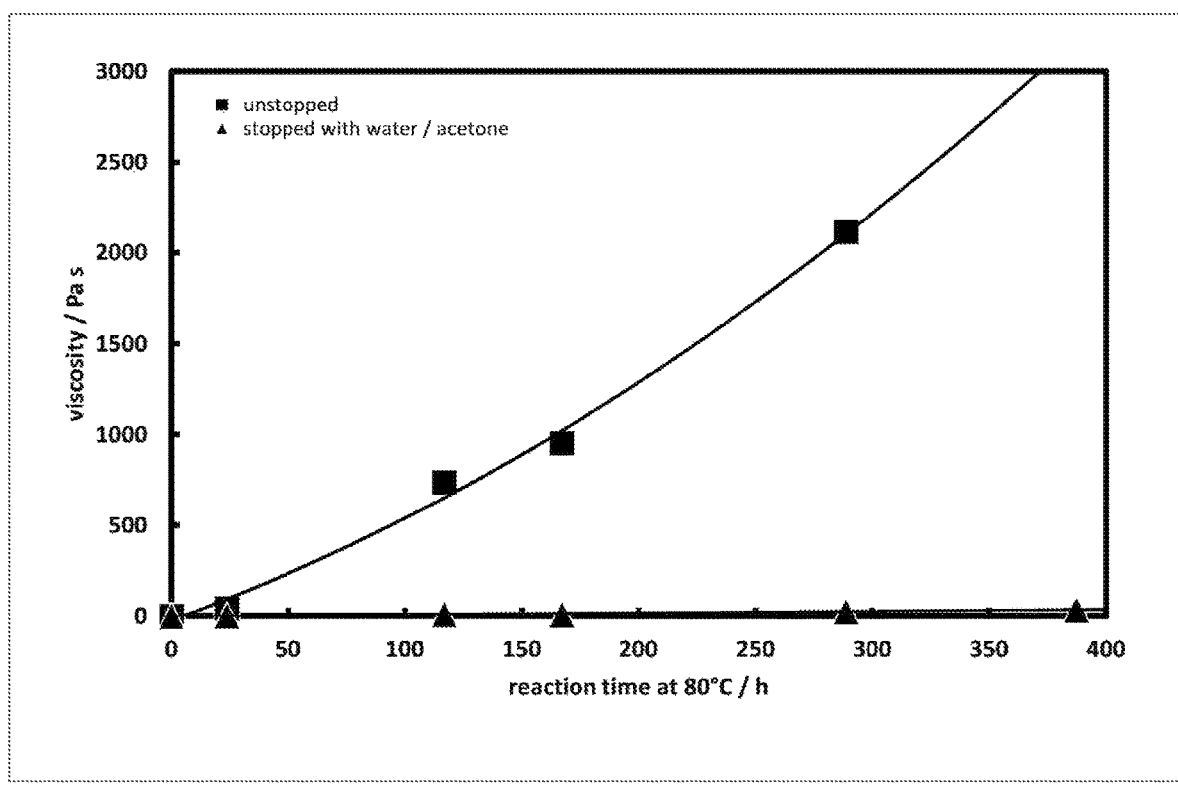
FIG. 2 shows that even at 80° C. virtually no further polymerization takes place while without addition of an initiation scavenger the polymerization proceeds vigorously.

After the desired viscosity has been reached the reaction is stopped by adding an amount of a water-acetone mixture equal to the amount of initiator (1:1 ratio) as initiation scavenger. FIG. 2 shows that even at 80° C. virtually no further polymerization still takes place while without addition of an initiation scavenger the polymerization proceeds vigorously.

Example 2

Initiation with Highly-Dilute Photoinitiators

In a 2 l glass reactor a photoinitiator (triarylsulphonium hexafluoroantimonate) was added to 1 kg of Epon Resin 828 under exclusion of light and under a nitrogen atmosphere at 23° C. with stirring (50 rpm). Initiation of the reaction was effected by 2-minute irradiation with 4 medium pressure Hg lamps positioned radially around the polymerization reactor.

To enable determination of the viscosities, samples were taken at different reaction times during the reaction and analyzed by means of GPC and viscometry.

TABLE 3 viscosities of inventive epoxy syrups initiated with triarylsulphonium hexafluoroantimonate

| amount of photoinitiator [%] | viscosity after 120 h [mPa s] |
|---|---|
| 0.004 | 500 |
| 0.01 | 860 |
| 0.02 | 1300 |

It is apparent that markedly smaller amounts of initiator are required and that for a given reaction time viscosities increase with increasing amount of initiator.

Example 3

Initiation with Highly-Dilute Thermal Initiators 0.02% of TAG-2678 was added to a 30% solution of Uvacure 1500 in toluene and the mixture was heated under reflux. After the desired reaction time the cooling was deactivated and the solvent removed. As in the other examples a completely transparent colourless epoxy syrup was obtained. Even after 1 h of reaction time, viscosities more than double the viscosity of the reactant were measured.

Example 3 shows that with thermal initiators too, viscous epoxy syrups can be prepared in solution and without protective gas.

The invention claimed is:
1. Process for producing an epoxy adhesive comprising:
   providing an at least one liquid multifunctional epoxy;
   adding to the at least one liquid multifunctional epoxy an initiator selected from the group consisting of an electron-poor monoisocyanate, a photoinitiator, and a thermal initiator;
   mixing the at least one liquid multifunctional epoxy and the initiator;
   cationically polymerizing the at least one liquid multifunctional epoxy, thereby forming an epoxy syrup comprising an at least one uncrosslinked polyepoxy; and
   mixing the epoxy syrup with further components to form an epoxy adhesive,
   wherein:
   a viscosity of the epoxy syrup is at least twice as high as a viscosity of the at least one liquid multifunctional epoxy before the addition of the initiator; and the cationic polymerization is stopped upon reaching a desired viscosity by the addition of an initiator scavenger.

2. Process according to claim 1, wherein the at least one liquid multifunctional epoxy is a bisepoxy.

3. Process according to claim 1, wherein the at least one liquid multifunctional epoxy is a bisepoxycyclohexyl derivative or a bisepoxy based on bisphenol A, bisphenol S, or bisphenol F.

4. Process according to claim 1, wherein the at least one liquid multifunctional epoxy comprises 3,4-epoxycyclohexylmethyl-3,4-epoxycyclohexane carboxylate.

5. Process according to claim 1, wherein:
the initiator is selected from the group consisting of a photoinitiator and a thermal initiator; and the initiator is present in an amount of not more than 0.1 wt %.

6. Process according to claim 1, wherein:
the initiator is an electron-poor monoisocyanate; and the initiator is present in an amount of not more than 10 wt %.

7. Process according to claim 6, wherein the initiator is selected from the group consisting of a p-tolyl isocyanate, an o-tolyl isocyanate, and a sulphonyl isocyanate.

8. Process according to claim 6, wherein the process is carried out at a temperature between 20° C. and 120° C.

9. Process according to claim 1, wherein the initiator scavenger comprises a mixture of water and acetone, a solution comprising an alkali metal hydroxide, a solution comprising an alkaline earth metal hydroxide, a solution comprising an alkali metal hydroxide, or a solution comprising an alkaline earth metal alkoxide.

10. Process according to claim 1, wherein the epoxy syrup has a polydispersity D of at least 3.

11. Process according to claim 1, wherein:
the at least one liquid multifunctional epoxy comprises a plurality of original epoxy groups; and
at least 65% of the plurality of original epoxy groups are present in the epoxy syrup.

12. Process according to claim 1, wherein the viscosity of the epoxy syrup is at least 10 Pa s.

13. Process according to claim 1, wherein the epoxy syrup has a weight-average molecular weight Mw in the range of 5,100 to 78,400 g/mol.

14. Process according to claim 1, wherein the at least one uncrosslinked polyepoxy has a molecular weight of from 2,000 to 300,000 g/mol.

15. Process according to claim 1, wherein the epoxy adhesive is obtained in a solvent process.

16. Process according to claim 1, wherein the epoxy adhesive is obtained in a hotmelt process.

* * * * *